(12) United States Patent
Dorevitch

(10) Patent No.: US 9,793,917 B2
(45) Date of Patent: Oct. 17, 2017

(54) METHOD AND APPARATUS FOR ADJUSTING A BANDWIDTH OF A SIGMA DELTA CONVERTER

(71) Applicant: MOTOROLA SOLUTIONS, INC., Schaumburg, IL (US)

(72) Inventor: Joshua E. Dorevitch, Yad Benyamin (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 39 days.

(21) Appl. No.: 14/887,024

(22) Filed: Oct. 19, 2015

(65) Prior Publication Data
US 2017/0111057 A1 Apr. 20, 2017

(51) Int. Cl.
*H03D 1/00* (2006.01)
*H03M 3/00* (2006.01)
*H04B 1/16* (2006.01)

(52) U.S. Cl.
CPC ............. *H03M 3/51* (2013.01); *H03M 3/344* (2013.01); *H03M 3/376* (2013.01); *H03M 3/50* (2013.01); *H04B 1/16* (2013.01)

(58) Field of Classification Search
CPC ........ H03M 1/66; H03M 1/0626; H03M 3/49; H03M 3/50
USPC ............................................. 375/343; 341/143
See application file for complete search history.

(56) References Cited

U.S. PATENT DOCUMENTS

| | | | |
|---|---|---|---|
| 5,408,233 A * | 4/1995 | Gannon | G06J 1/00 341/131 |
| 5,412,387 A | 5/1995 | Vincelette et al. | |
| 5,619,731 A | 4/1997 | Jenkins et al. | |
| 5,737,961 A * | 4/1998 | Hanisko | B60R 21/0132 73/1.38 |
| 6,255,974 B1 | 7/2001 | Morizio et al. | |
| 6,587,063 B1 | 7/2003 | Su | |
| 7,051,590 B1 * | 5/2006 | Lemkin | G01C 19/5719 73/504.04 |
| 7,250,886 B1 * | 7/2007 | Killat | H03K 17/0416 341/143 |

(Continued)

FOREIGN PATENT DOCUMENTS

| | | |
|---|---|---|
| EP | 116332 | 8/1984 |
| EP | 695481 | 2/1996 |
| WO | 94/23502 | 10/1994 |

*Primary Examiner* — Daniel Washburn
*Assistant Examiner* — Sarah Hassan
(74) *Attorney, Agent, or Firm* — Michael Best & Friedrich LLP

(57) ABSTRACT

A method and apparatus for adjusting a bandwidth of a sigma delta converter by adjusting a reference voltage provided to the sigma delta converter. The apparatus includes a switched capacitor digital-to-analog converter in the feedback loop of the sigma delta modulator. The sigma delta modulator determines the bandwidth mode of the converter and adjusts the reference voltage to deliver high performance functionality. In one embodiment, a multi-bit digital signal is received by the digital-to-analog converter. The reference voltage is provided to multiple capacitive circuits of the digital-to-analog converter and the capacitive circuits are activated and deactivated based on the multi-bit digital signal. The digital-to-analog converter, thus, provides a feedback analog signal using dynamic element matching.

20 Claims, 4 Drawing Sheets

(56) References Cited

U.S. PATENT DOCUMENTS

| | | |
|---|---|---|
| 7,362,252 B1 | 4/2008 | Pai |
| 7,903,017 B2 | 3/2011 | Hsieh et al. |
| 9,065,474 B2 | 6/2015 | Bernardinis |
| 2003/0056597 A1* | 3/2003 | Wang .................. G01L 9/12 73/718 |
| 2005/0038847 A1* | 2/2005 | Cheng ................... H03M 3/444 709/201 |
| 2008/0022762 A1* | 1/2008 | Skurnik .............. B60C 23/0408 73/146.5 |
| 2008/0297388 A1* | 12/2008 | Thiagarajan .......... H03M 3/394 341/143 |
| 2010/0097256 A1* | 4/2010 | Hurrell ................ H03M 1/145 341/143 |
| 2011/0163901 A1* | 7/2011 | Quiquempoix ..... H03M 1/0663 341/143 |
| 2012/0051407 A1* | 3/2012 | Ji ....................... H03H 17/0642 375/219 |

* cited by examiner

METHOD AND APPARATUS FOR ADJUSTING A BANDWIDTH OF A SIGMA DELTA CONVERTER

BACKGROUND OF THE INVENTION

Sigma delta (sometimes referred to as "delta sigma") modulation is a method for encoding analog signals into digital signals. Sigma delta analog-to-digital converters (ADCs) are used in a variety of devices and sometimes used in the receivers of software defined radios (SDRs) and similar devices.

Receivers in software defined radios must often be able to receive and process signals of multiple bandwidths. In some applications, the receiver and, therefore, the analog-to-digital converter is required to be able to process both narrowband and broadband signals. Generally, narrowband refers to communications that use frequency content within the coherence band of a frequency channel, and broadband refers to the use of frequency ranges beyond those used by narrowband communications. Narrowband and broadband communications may have conflicting hardware requirements. For example, to receive and process narrowband signals, a receiver circuit should have a high dynamic range and low switching noise (for example, kT/C noise) (where k is Boltzmann's constant in joules per Kelvin, T is the capacitor's absolute temperature, and C is the capacitor's capacitance in farads). To achieve low switching noise, a receiver may need to incorporate large capacitors. On the other hand, to receive and process broadband signals, a receiver circuit should run at high speeds, while a relatively modest dynamic range may be sufficient. To run at high speeds, small capacitors are preferred.

Analog-to-digital converters are often implemented using switched capacitor circuits. To handle different bandwidths, the number of capacitors can become quite large making the analog-to-digital converter complex. Having a large number of capacitors can also increase costs. With conventional approaches to receiver design, it becomes difficult to handle multiple bandwidths without significant compromise.

Accordingly, there is a need for a method and apparatus for adjusting the bandwidth of a sigma delta converter.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
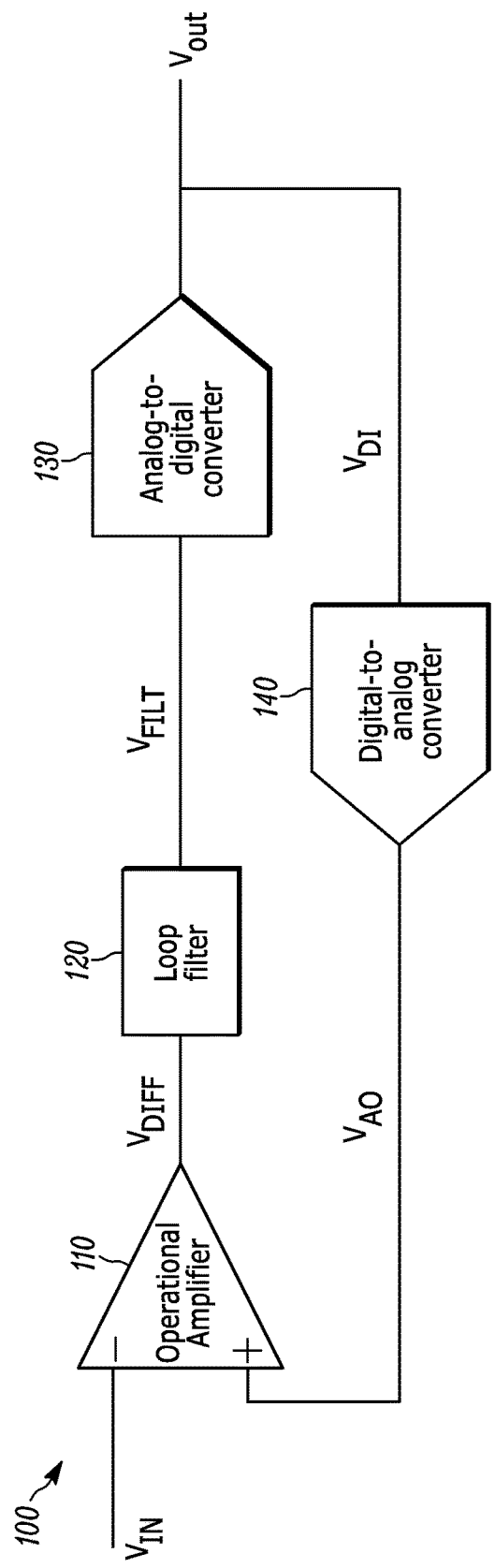
FIG. 1 is a block diagram of a sigma delta modulator of an analog-to-digital converter in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One embodiment provides a method of adjusting a bandwidth mode of a sigma delta converter. The method includes determining a bandwidth mode of the sigma delta converter and receiving a digital input signal by a first capacitive circuit of a switched-capacitor digital-to-analog converter. The method also includes adjusting a reference voltage provided to a second capacitive circuit of the digital-to-analog converter and charging the capacitive circuits on one clock cycle (for example, a first clock cycle). The digital-to-analog converter discharges the capacitive circuits on the next clock cycle (for example, a second clock cycle) and sums the discharged signals from the capacitive circuits onto an integrator. An integrated signal from the integrator is then fed back to an operational amplifier of the sigma delta convertor.

Another embodiment provides an apparatus for adjusting a bandwidth mode of a sigma delta converter by adjusting a reference voltage provided to the sigma delta converter. The apparatus includes a switched-capacitor digital-to-analog converter having a first capacitive circuit and a second capacitive circuit. The first capacitive circuit samples a digital input signal on one clock cycle and discharges onto an integrator on the next clock cycle. The second capacitive circuit samples a reference voltage on one clock cycle and discharges onto the integrator on the next clock cycle. In one embodiment, the apparatus includes an electronic processor that varies the reference voltage according to the bandwidth mode of the sigma delta converter. The integrator then outputs an analog signal representative of the digital input signal.

For multi-bit operation, a multi-bit digital signal is provided to the digital-to analog converter. In one implementation, a dynamic element matching algorithm is used to activate and deactivate multiple capacitive circuits in the digital-to analog converter. The capacitive circuits sample the reference voltage provided and discharge onto the integrator to provide an analog signal representative of the input multi-bit digital signal.

Some embodiments provide a multi-band sigma delta converter. In these embodiments, the sigma delta converter is capable of operating in both a narrowband and a broadband mode. In a narrowband mode, the sigma delta analog-to-digital converter is configured to receive analog signals in a narrow frequency range. Whereas, in a broadband mode, the sigma delta analog-to-digital converter is configured to receive analog signals in a wide frequency range.

FIG. 1 is a block diagram of a sigma delta modulator 100 of an analog-to-digital converter. In the example illustrated, the sigma delta modulator 100 includes an operational amplifier 110, a loop filter 120, an analog-to-digital converter 130, and a digital-to-analog converter 140. In other embodiments, the sigma delta modulator 100 may be a higher-order modulator having more than one operational amplifier and one loop filter.

In the embodiment shown, the operational amplifier 110 is configured to receive an analog input signal $V_{IN}$ from an antenna (not shown). In other embodiments, the input signal $V_{IN}$ could be provided from a source other than the antenna. The operational amplifier 110 also receives a feedback signal $V_{AO}$ from the digital-to-analog converter 140. The operational amplifier 110 outputs a signal $V_{DIFF}$ that is representative of a difference between the input signal $V_{IN}$ from the antenna and the feedback signal $V_{AO}$ from the digital-to-analog converter 140. Other kinds of operational amplifiers such as a differential amplifier, a summing amplifier, an integrator, a comparator etc., may be used in the sigma delta modulator. Further, a fully differential amplifier may also be used as the operational amplifier 110.

The loop filter 120 receives the output signal $V_{DIFF}$ from the operational amplifier 110. The loop filter 120 outputs a filtered signal $V_{FILT}$ to the analog-to-digital converter 130. The filtered signal $V_{FILT}$ may be, for example, an integral, a derivative or an attenuated signal of the input signal $V_{IN}$. In other embodiments, the loop filter 120 may be replaced by an integrator.

The analog-to-digital converter 130 receives the filtered signal $V_{FILT}$ and outputs a modulated digital signal $V_{OUT}$ representative of the received analog signal. The analog-to-digital converter 130 may be single-bit or multi-bit converter. A comparator may be implemented as a single bit analog-to-digital converter. In one particular embodiment, the modulated digital signal $V_{OUT}$ is then passed through a digital filter (not shown) and a decimator (not shown) before being provided to a communications device such as a software defined radio.

The digital-to-analog converter 140 receives the modulated digital signal $V_{OUT}$ from the analog-to-digital converter 130 as digital voltage input $V_{DI}$ and converts it into an analog voltage output $V_{AO}$ to be fed back into the operational amplifier 110. In certain embodiments there may be an integrator between the output of the digital-to-analog converter 140 and the operational amplifier 110. The digital-to-analog converter 140 may be a single-bit or a multi-bit digital-to-analog converter.

A sigma delta modulator generally requires linear analog-to-digital and digital-to-analog converters to achieve a useful level of performance. Single-bit analog-to-digital and digital-to-analog converters are linear by nature. For multi-bit operation, however, linearity can be achieved by using dynamic element matching (DEM). Dynamic element matching is a technique to linearize a multi-bit digital-to-analog converter in the feedback loop of a sigma delta converter. Dynamic element matching can also shape the mismatch resultant noise from the desired band.

Figure 2:
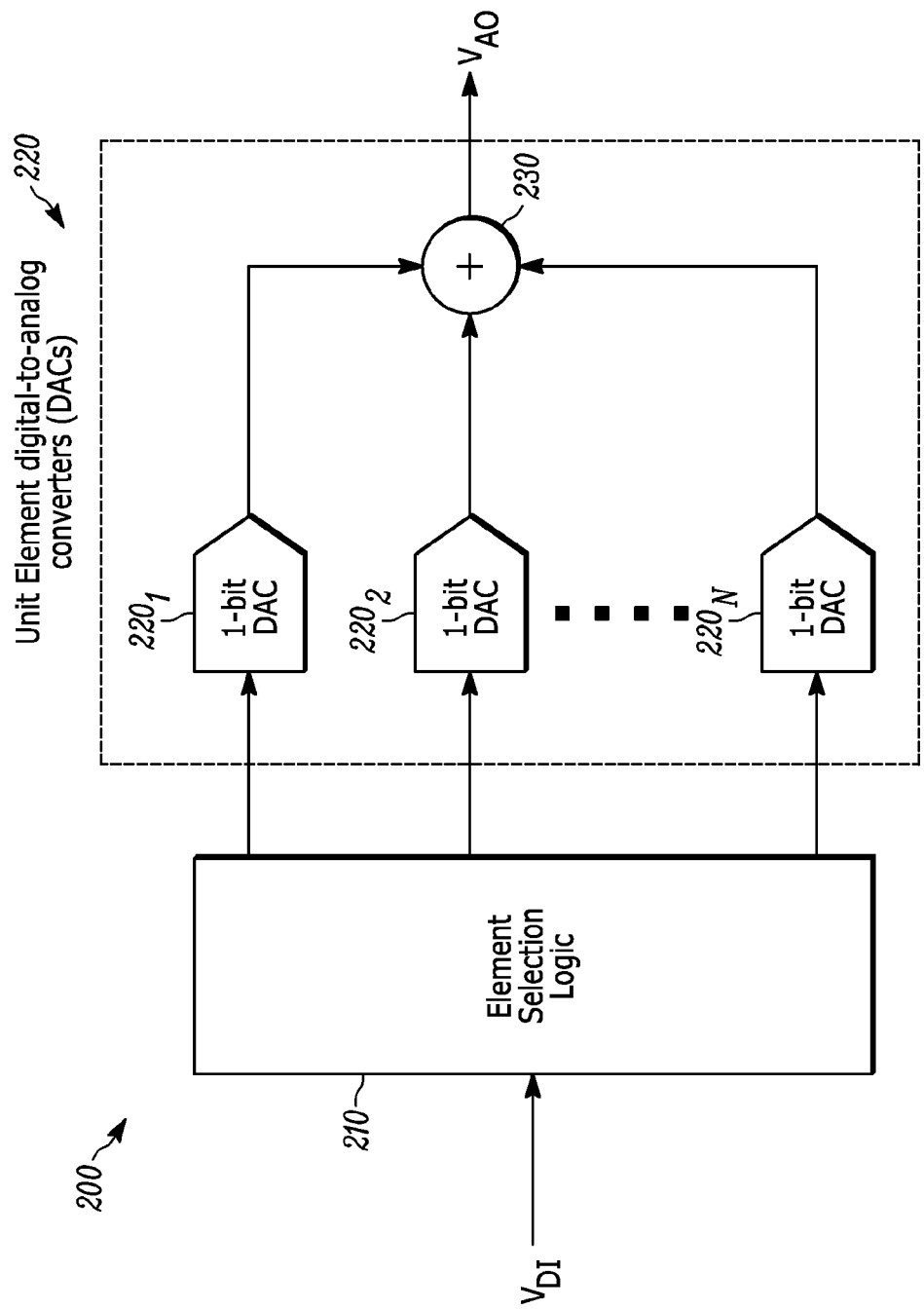
FIG. 2 is a block diagram of a dynamic element matching (DEM) digital-to-analog converter (DAC) in accordance with some embodiments.

FIG. 2 is a block diagram of a dynamic element matching (DEM), digital-to-analog converter (DAC) 200. Hereafter, "DEM DAC" 200. The DEM DAC 200 includes an element selection logic 210, one or more unit element (e.g., single-bit), digital-to-analog converters $220_{1-N}$, and a summing junction 230. In certain embodiments where the sigma delta modulator 100 is operating in a multi-bit mode, the digital-to-analog converter 140 may be implemented as the DEM DAC 200.

The element selection logic 210 may be implemented using an electronic processor or similar programmable device. The element selection logic 210 may also be implemented using an application specific integrated circuit or similar device. The element selection logic 210 receives a digital voltage input $V_{DI}$ from the analog-to-digital converter 130 of FIG. 1 and provides 1-bit signals to the one or more unit element, digital-to-analog converters $220_{1-N}$. The element selection logic 210 selects which of the one or more unit element, digital-to-analog converters $220_{1-N}$ will be used on any given word. This is done to reduce the effect of element mismatch at a specific frequency band. Other technologies may be used to realize the dynamic element matching logic.

Figure 3:
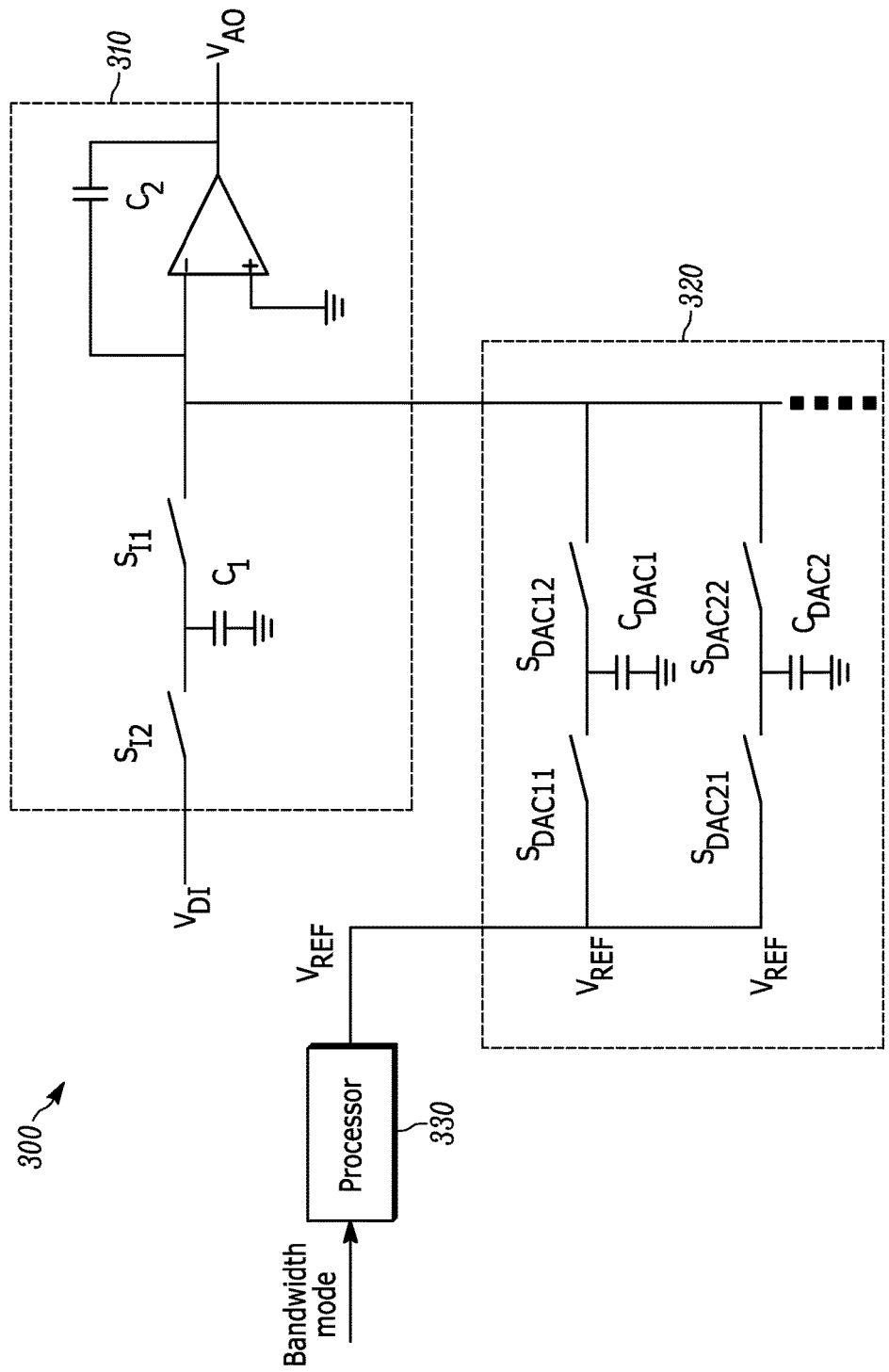
FIG. 3 is a block diagram of a switched capacitor, digital-to-analog converter of a sigma-delta analog-to-digital converter in accordance with some embodiments.

The one or more unit element, digital-to-analog converters $220_{1-N}$ may be implemented as switched capacitor circuits as shown in FIG. 3. The element capacitors $C_{DAC1-N}$ correspond to unit element, digital-to-analog converters $220_{1-N}$. The one or more unit element, digital-to-analog converters $220_{1-N}$ receive an input signal from the element selection logic 210 and provide output to the summing junction 230. The summing junction 230 sums the output signals from the one or more unit element, digital-to-analog converters $220_{1-N}$ to output an analog voltage output $V_{AO}$ corresponding to the digital voltage input $V_{DI}$ received from the analog-to-digital converter 130 of FIG. 1.

FIG. 3 is a block diagram of a switched capacitor (SC) digital-to-analog converter (DAC) 300. The switched capacitor digital-to-analog converter 300 includes a switched capacitor integrator 310, a digital-to-analog converter block 320, and an electronic processor, for example, microprocessor 330. In the example illustrated, the switched capacitor integrator 310 includes, a digital voltage input $V_{DI}$, an input sampling capacitor $C_1$ (for example, a first capacitive circuit), an integrating capacitor $C_2$, switches $S_{I1}$ (for example, a first charging switch) and $S_{I2}$ (for example, a first discharging switch), and a voltage output $V_{AO}$.

In the example illustrated, the digital input voltage $V_{DI}$ is the digital signal from the analog-to-digital converter 130 of FIG. 1. In certain embodiments, the digital input voltage $V_{DI}$ is provided to both the sampling capacitor $C_1$ and the element selection logic 210 of FIG. 2. In other embodiments, the input voltage may be provided only to the element selection logic 210 of FIG. 2. In certain embodiments, the element selection logic 210 may be implemented by the microprocessor 330 and the digital input voltage $V_{DI}$ may be provided to the microprocessor 330. The analog voltage output $V_{AO}$ is a reconstructed analog signal generated from the digital output of the analog-to-digital converter 130 of FIG. 1. The analog voltage output $V_{AO}$ is fed back into the operational amplifier 110 of FIG. 1.

In one embodiment, the digital-to-analog converter block 320 includes a reference voltage input $V_{REF}$, one or more element capacitors $C_{DAC1-N}$ (for example, second capacitive circuit and third capacitive circuit) to perform digital-to-analog conversion, switches $S_{DAC1-N,1}$ (for example, a second charging switch and a third charging switch) and $S_{DAC1-N,2}$ (for example, a second discharging switch and a third discharging switch) for each element capacitor $C_{DAC1-N}$. The reference voltage $V_{REF}$ may be internal to the switched capacitor digital-to-analog converter 300 or may be provided from an external source, as is discussed in greater detail below.

In certain embodiments, sampling capacitor $C_1$ may be connected in series with the digital-to-analog converter block 320. In yet other embodiments, switches $S_{DAC1-N,1}$ and $S_{DAC1-N,2}$ may be connected between the element capacitors $C_{DAC1-N}$ and ground. Connections other than those described and illustrated are possible.

In certain embodiments, the switched capacitor integrator 310 may be implemented separately from the switched capacitor digital-to-analog converter 300. Other embodiments may include element capacitors that implement the dynamic element matching logic. Thus, FIG. 3 should be considered as illustrating one example, and not as an exclusive embodiment.

In one embodiment, the microprocessor 330 receives a bandwidth mode as an input and provides a reference voltage $V_{REF}$ corresponding to the bandwidth mode input. The bandwidth mode of the analog-to-digital converter depends on the application of the analog-to-digital converter. For example, the microprocessor 330 adjusts the reference voltage to a value corresponding to the narrowband mode when the analog-to-digital converter is operating in a narrowband mode. The microprocessor 330 adjusts the reference voltage to a value corresponding to the broadband mode when the analog-to-digital converter is operating in a broadband mode. The microprocessor 330 may also be configured to vary the reference voltage based on the application of the analog-to-digital converter.

Switches $S_{I1}$, $S_{I2}$, $S_{DAC1-N,1}$, and $S_{DAC1-N,2}$ have an open state and a closed state or, more generally speaking may be opened or closed. When switch $S_{I1}$ is closed, switch $S_{I1}$ connects the capacitor $C_1$ to the digital input voltage $V_{DI}$. When switch $S_{I1}$ is open, the capacitor $C_1$ is disconnected from the digital input voltage $V_{DI}$.

In operation, switches $S_{I1}$ and $S_{DAC1-N,1}$ are closed and switches $S_{I2}$ and $S_{DAC1-N,2}$ are open during one clock cycle (for example, a first clock cycle) to allow the sampling capacitor $C_1$ and element capacitors $C_{DAC1-N}$ to sample the voltage. In this clock cycle, the sampling capacitor $C_1$ and element capacitors $C_{DAC1-N}$ are charged using the digital input voltage $V_{DI}$ and reference voltage $V_{REF}$ respectively. During the next clock cycle (for example, a second clock cycle), switches $S_{I1}$ and $S_{DAC1-N,1}$ are closed and switches $S_{I2}$ and $S_{DAC1-N,2}$ are open. In certain embodiments, the switches $S_{I1}$, $S_{I2}$, $S_{DAC1-N,1}$, and $S_{DAC1-N,2}$ are controlled by the element selection logic 210 of FIG. 2. In such embodiments, the element selection logic 210 implements a dynamic element matching algorithm using the switches $S_{DAC1-N,1}$ and $S_{DAC1-N,2}$. In other embodiments, the element selection logic 210 may be implemented by the microprocessor 330. In such embodiments, the microprocessor 330 controls the switches $S_{I1}$, $S_{I2}$, $S_{DAC1-N,1}$, and $S_{DAC1-N,2}$.

In the switched capacitor integrator 310, when switch $S_{I1}$ is closed, the sampling capacitor $C_1$ samples the digital input voltage $V_{DI}$. When $S_{I2}$ is closed, the sampling capacitor $C_1$ outputs a first discharge signal onto the integrating capacitor $C_2$. In the digital-to-analog converter block 320, when switches $S_{DAC1-N,1}$ are closed, element capacitors $C_{DAC1-N}$ sample the reference voltage $V_{REF}$. When switches $S_{DAC1-N,2}$ are closed, each of the element capacitors $C_{DAC1-N}$ output a discharge signal (for example, second discharge signal and third discharge signal) onto the integrating capacitor $C_2$. The switched capacitor integrator 310 outputs an analog voltage output $V_{AO}$ based on the first discharge signal and the second discharge signal.

For multi-bit operation, the microprocessor 330 may be used to implement the element selection logic 210. In multi-bit operation, the digital voltage input $V_{DI}$ is a multi-bit digital signal. The microprocessor 330 activates and deactivates the element capacitors $C_{DAC1-N}$ based on the multi-bit digital signal. As such, the microprocessor 330 selects which of the element capacitors are active for any given word of the multi-bit digital signal. The microprocessor 330 may activate and deactivate the element capacitors $C_{DAC1-N}$ by controlling switches $S_{DAC1-N,1}$ and $S_{DAC1-N,2}$. For example, for a given word of the multi-bit digital signal, the microprocessor 330 may signal the switch $S_{DAC1,1}$ to close to activate the element capacitor $C_{DAC1}$ and signal the switch $S_{DAC2,1}$ to open to deactivate the element capacitor $C_{DAC2}$. Other methods of activating and deactivating element capacitors $C_{DAC1-N}$ are also possible.

Before discussing the remainder of the digital-to-analog converter block 320, it is useful to remember that narrowband applications of a receiver require a relatively high dynamic range. As noted, switched capacitor circuits are capable of providing a high dynamic range. However, one of the limitations to high performance is switching noise. In order to reduce noise, large capacitors are needed.

On the other hand, broadband applications only need moderate dynamic range, but need to run at very high speeds. Sigma delta converters generally require oversampling ratios (i.e., sampling at a rate much higher than the Nyquist rate). As a consequence, broadband applications need high clock speed. Operational amplifiers in the converter need to be about ten times faster than the sampling rate for switched capacitor circuits. The faster operational amplifiers use the capacitive load to set the dominant pole. To increase speed of the circuit, small capacitive loads are required.

In one embodiment, relatively high dynamic range and relatively high speed may be achieved by changing a reference voltage rather than capacitance values. The reference voltage $V_{REF}$ can be changed using a logic circuit. For narrowband applications, a high $V_{REF}$ reduces switching noise. For broadband applications, a low $V_{REF}$ reduces the capacitive loads, thereby, increasing the speed of the digital-to-analog converter 140 of FIG. 1. The reference voltage $V_{REF}$ may be varied over a wide range of values in order to facilitate a wide range of applications. The microprocessor 330 changes the reference voltage based on the application of the analog-to-digital converter. However, the transfer function or loop gain of the converter are not affected by varying the reference voltage. In certain embodiments, a logic circuit may be used to vary the reference voltage.

In certain embodiments, different capacitances may be switched in and out of the switched capacitor digital-to-analog converter 300. This may be done to improve the performance of the sigma delta analog-to-digital converter. For example, in a narrowband mode, a capacitor with a large capacitance (for example, 2.6 picofarads) may be switched into the sampling capacitor $C_1$ and/or integrating capacitor $C_2$ of the switched capacitor digital-to-analog converter 300. This in combination with using a high $V_{REF}$ (for example, 2 volts) provides desired performance of the digital-to-analog converter 140 in the narrowband mode. Of course, the exact value of the capacitance and reference voltage will vary depending upon, among other things, the bandwidth of the narrowband. The relatively large capacitance utilized in a narrowband mode can be referred to as a capacitance corresponding to the narrowband mode. In a broadband mode, a capacitor with a small capacitance (for example 0.5 picofarads) may be switched into the sampling capacitor $C_1$ and/or integrating capacitor $C_2$ of the switched capacitor digital-to-analog converter 300. This in combination with using a low $V_{REF}$ (for example, 0.5 volts) provides desired performance of the digital-to-analog converter in a broadband mode. The relatively small capacitance utilized in a broadband mode can be referred to as a capacitance corresponding to the broadband mode. However, the capacitance values of element capacitors $C_{DAC1-N}$ may be kept constant through the different bandwidth modes. Changing the reference voltage $V_{REF}$ (instead of switching in different capacitance values for each of the element capacitors $C_{DAC1-N}$ to adjust the bandwidth of the analog-to-digital converter) significantly reduces the number of switches and capacitors.

In certain embodiments, switching in capacitor values is achieved by having capacitors of different capacitances connected in parallel and controlled by switches. A first capacitor with a first capacitance is activated for a first bandwidth mode. Activating is achieved by closing the switch associated with the first capacitor and opening all other switches connected to other capacitors. For a second bandwidth mode, a second capacitor with a second capacitance may be activated.

In certain embodiments, fully differential switched capacitor circuits may be used to implement the switched capacitor digital-to-analog converter 300. For example, a person skilled in the art would recognize that a fully differential switched capacitor integrator may be used for the switched capacitor integrator 310.

Figure 4:
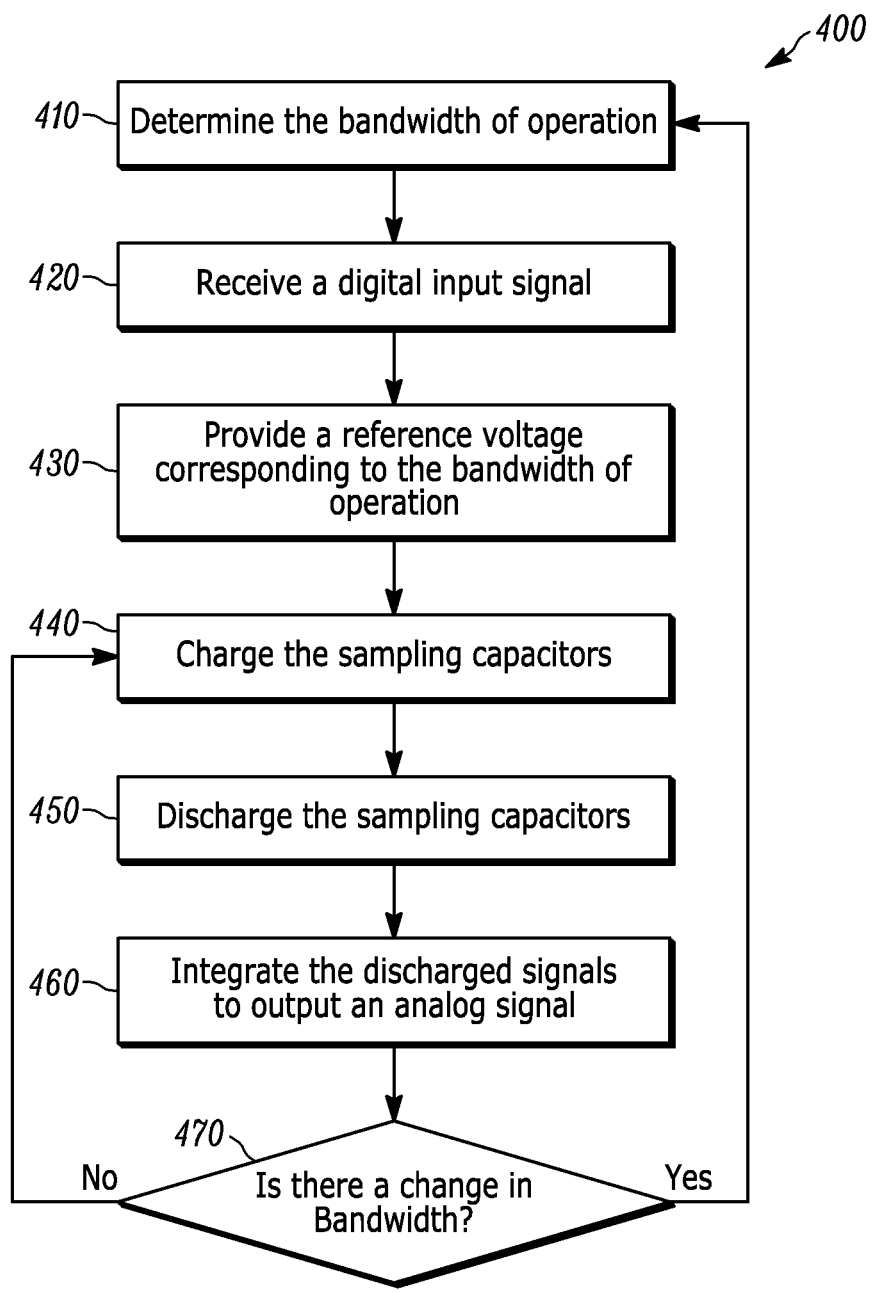
FIG. 4 is a flowchart of a method of multi-band sigma delta conversion in accordance with some embodiments.

FIG. 4. is a flowchart of an exemplary method 400 of multiple bandwidth, sigma delta conversion. Although the method blocks are described in conjunction with the systems and devices of FIGS. 1, 2, and 3, method 400 could be utilized with other systems or devices. In addition, the method 400 may be modified or performed differently than the specific example provided.

The method 400 begins in block 410, where the sigma delta modulator 100 of FIG. 1 determines the bandwidth mode of the sigma delta analog-to-digital converter. For example, whether the sigma delta analog-to-digital converter is operating in a narrowband mode or a broadband mode. In block 420, the switched capacitor digital-to-analog converter 300 receives a digital input voltage from the analog-to-digital converter 130. In block 430, the sigma delta modulator 100 provides a reference voltage $V_{REF}$ to the switched capacitor digital-to-analog converter 300 from a plurality of reference voltages. The reference voltage $V_{REF}$ provided corresponds to the bandwidth mode of the sigma delta analog-to-digital converter. In other embodiments, the bandwidth mode is provided as an input to the sigma delta analog-to-digital converter or the switched capacitor digital-to-analog converter 300.

In block 440, the sampling capacitor $C_1$ and the element capacitors $C_{DAC1-N}$ sample the digital input signal $V_{DI}$ and reference voltage $V_{REF}$ respectively. In block 450, the sampling capacitor $C_1$ and the element capacitors $C_{DAC1-N}$ discharge onto the switched capacitor integrator 310. In block 460, the integrator integrates the discharged signals and provides an analog output that is fed back to the operational amplifier 110.

In block 480, the analog-to-digital converter determines when there is a change in the bandwidth. When there is a change in the bandwidth the switched capacitor digital-to-analog converter 300 loops back to block 410. When no change in the bandwidth is detected, the digital-to-analog converter loops back to block 440 to continue sampling the digital input signal $V_{DI}$ and convert it to an analog voltage output $V_{AO}$. In other embodiments, the switched capacitor digital-to-analog converter 300 may determine when there is a change in the bandwidth. In yet other embodiments, the microprocessor 330 may be used to determine when there is a change in the bandwidth.

One advantage of the technique disclosed is that there is little or no increase in noise when the reference voltage is scaled down. Often, capacitors used in a digital-to-analog converter are small and cannot be scaled down for broadband applications. Further, scaling down capacitors increases the noise in the circuit. Varying the voltage instead of scaling the digital-to-analog converter capacitors does not increase noise while also maintaining the transfer function of the circuit.

Another advantage of the technique is that the use of dynamic element matching is more practical and less costly than a number of other sigma delta converter designs. In multi-bit digital-to-analog converters there can be a large number of capacitors. It becomes impractical to have programmable switched capacitor circuits due to the overhead of the large number of switches and capacitors. Varying the reference voltage, instead of capacitance, makes it easier to implement multi-bit digital-to-analog converters which require implementation of more capacitors.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A method of adjusting a bandwidth of a sigma delta converter, the method comprising:
   determining a bandwidth mode of a digital-to-analog converter;
   receiving a digital input signal by a first capacitive circuit;
   adjusting, by an electronic processor, a reference voltage received by a second capacitive circuit to a value corresponding to the bandwidth mode;
   charging the first capacitive circuit using the digital input signal; charging the second capacitive circuit using the reference voltage;
   outputting a first discharge signal from the first capacitive circuit and a second discharge signal from the second capacitive circuit to an integrator; and
   outputting an integrated signal based on the first discharge signal and the second discharge signal from the integrator.

2. The method of claim 1, further comprising:
   determining that the digital-to-analog converter is operating in a narrowband mode;
   switching in a capacitor in the first capacitive circuit, wherein the capacitor has a capacitance corresponding to the narrowband mode; and
   adjusting the reference voltage to a value corresponding to the narrowband mode.

3. The method of claim 1, further comprising:
   determining that the digital-to-analog converter is operating in a broadband mode;
   switching in a capacitor in the first capacitive circuit, wherein the capacitor has a capacitance corresponding to the broadband mode; and
   adjusting the reference voltage to a value corresponding to the broadband mode.

4. The method of claim 1, further comprising:
   closing a first charging switch and a second charging switch on a first clock cycle to charge the first capacitive circuit and the second capacitive circuit; and
   closing a first discharging switch and a second discharging switch on a second clock cycle to discharge the first capacitive circuit and the second capacitive circuit.

5. The method of claim 1, further comprising:
   activating a third capacitive circuit based on the digital input signal;
   charging the third capacitive circuit using the reference voltage; and
   discharging a third discharge signal from the third capacitive circuit onto the integrator.

6. A digital-to-analog converter, comprising:
   a digital voltage input to receive a digital input signal;
   a reference voltage input to receive a reference voltage;
   a first capacitive circuit electrically coupled to the digital voltage input to sample the digital input signal;
   a second capacitive circuit electrically coupled to the reference voltage input to sample the reference voltage;
   an integrator electrically coupled to the first capacitive circuit and to the second capacitive circuit; and
   an electronic processor that controls the reference voltage based on a bandwidth mode of the digital-to-analog converter.

7. The digital-to-analog converter of claim 6, wherein the first capacitive circuit further comprises:
   a capacitor;
   a first charging switch electrically coupled to the capacitor of the first capacitive circuit; and
   a first discharging switch electrically coupled to the integrator and to the capacitor of the first capacitive circuit to discharge a discharge signal from the capacitor onto the integrator.

8. The digital-to-analog converter of claim 7, wherein the first charging switch is electrically coupled between the digital voltage input and the capacitor of the first capacitive circuit.

9. The digital-to-analog converter of claim 7, wherein the first charging switch is electrically coupled between the capacitor of the first capacitive circuit and ground.

10. The digital-to-analog converter of claim 6, wherein the second capacitive circuit further comprises:
    a capacitor;
    a second charging switch electrically coupled to the capacitor of the second capacitive circuit; and
    a second discharging switch electrically coupled to the integrator and to the capacitor of the second capacitive circuit to discharge a discharge signal from the capacitor onto the integrator.

11. The digital-to-analog converter of claim 10, wherein the second charging switch is electrically coupled between the reference voltage input and the capacitor of the second capacitive circuit.

12. The digital-to-analog converter of claim 10, wherein the second charging switch is electrically coupled between the capacitor of the second capacitive circuit and ground.

13. The digital-to-analog converter of claim 10, wherein the digital input signal comprises a multi-bit digital signal.

14. The digital-to-analog converter of claim 13, further comprising a third capacitive circuit comprising:
    a capacitor;
    a third charging switch electrically coupled to the capacitor of the third capacitive circuit;

a third discharging switch the third discharging switch electrically coupled to the integrator and the capacitor to discharge a discharge signal from the capacitor onto the integrator.

15. The digital-to-analog converter of claim 14, wherein the electronic processor receives the multi-bit digital signal and signals the second charging switch to open and signals the third charging switch to close.

16. The digital-to-analog converter of claim 6, wherein the integrator is a switched capacitor integrator.

17. The digital-to-analog converter of claim 16, wherein the first capacitive circuit further comprises a first capacitor and a second capacitor.

18. The digital-to-analog converter of claim 17, wherein the electronic processor activates the first capacitor and deactivates the second capacitor in a narrowband mode.

19. The digital-to-analog converter of claim 17, wherein the electronic processor activates the second capacitor and deactivates the first capacitor in a broadband mode.

20. The digital-to-analog converter of claim 6, wherein the integrator is a fully differential switched capacitor integrator.

* * * * *